(12) United States Patent
Ishikawa

(10) Patent No.: US 6,493,274 B2
(45) Date of Patent: Dec. 10, 2002

(54) DATA TRANSFER CIRCUIT AND SEMICONDUCTOR INTEGRATED CIRCUIT HAVING THE SAME

(75) Inventor: Masatoshi Ishikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/985,350

(22) Filed: Nov. 2, 2001

(65) Prior Publication Data

US 2002/0159299 A1 Oct. 31, 2002

(30) Foreign Application Priority Data

Apr. 27, 2001 (JP) ........................................ 2001-131558

(51) Int. Cl.[7] ........................... G11C 7/00; H03K 17/62; H03K 17/76
(52) U.S. Cl. ................... 365/189.05; 365/233; 327/404; 327/408
(58) Field of Search ........................ 365/189.02, 189.05, 365/233, 203; 327/403, 404, 407, 408

(56) References Cited

U.S. PATENT DOCUMENTS 6,147,544 A * 11/2000 Tanizaki et al. ............ 327/403

FOREIGN PATENT DOCUMENTS

JP 2000-132970 5/2000
JP 2000-339968 12/2000

OTHER PUBLICATIONS

"500 Mb/s Nonprecharged Data Bus for High–Speed DRAM's", Saito et al., IEEE Journal of Solid–State Circuits, vol. 33, No. 11, Nov. 1998, pp. 1720–1730.

Related U.S. Application—Ser. No. 09/397,142, filed Sep. 16, 1999.

* cited by examiner

Primary Examiner—Son Mai
(74) Attorney, Agent, or Firm—McDermott, Will & Emery

(57) ABSTRACT

Disclosed is a low-power data transfer circuit having a high data transfer rate. This data transfer circuit of the invention includes a first selection circuit for selecting two signal lines out of three signal lines and precharging the remaining signal line to a first potential; and a second selection circuit for selecting and connecting the two data signal lines selected by the first selection circuit to a reception side circuit. With the configuration, a period of precharging a signal line is included in a data transfer period. Thus, there is no need to provide a specific precharge period after data transfer, and data can be transferred effectively.

7 Claims, 9 Drawing Sheets

US 6,493,274 B2

DATA TRANSFER CIRCUIT AND SEMICONDUCTOR INTEGRATED CIRCUIT HAVING THE SAME

BACKGROUND OF THE INVENTION

1. Field of the Invention

The present invention relates to a data transfer circuit and, more particularly, a data transfer circuit for transferring data synchronously with a clock signal.

2. Description of the Background Art

Conventionally, as a method of transferring data between semiconductor integrated circuit devices or in a semiconductor integrated circuit device, a method of precharging two data transfer lines disposed between a transmission side circuit and a reception side circuit once to the same potential (for example, "H" level) and setting one of the two data transfer lines selected according to transfer data to the "L" level, thereby transferring data "0" or "1" is known.

According to the data transfer method, each time data is transferred, the two data transfer lines have to be precharged once to the "H" level.

Consequently, when the data transfer lines become longer and wiring capacity and wiring resistance accordingly increase, time necessary for precharging becomes long, and it causes a problem such that the data transfer rate deteriorates.

Japanese Patent Laying-Open No. 2000-132970 discloses a method in which three data transfer lines are disposed between a transmission side circuit and a reception side circuit, while data is transferred by using two data transfer lines, the remaining data transfer line is precharged to the "H" level and, then, data is transferred by using the two data transfer lines of the "H" level including the precharged data transfer line among the three data transfer lines, thereby preventing deterioration in data transfer rate.

Since precharging is performed during data transfer, the data transfer system has, however, a problem that the power consumption is high as compared with the conventional technique of performing precharging after data transfer.

Japanese Patent Laying-Open No. 2000-339968 discloses a method of transferring charges between a data transfer line to be precharged and a data transfer line changed from the "H" level to the "L" level for data transfer, thereby reducing power consumption.

This method, however, has a problem of a low transfer rate due to a circuit operation of electrically connecting the data transfer lines at the time of data transfer to transfer charges, interrupting the electrical connection and, after that, further changing the potential of the data transfer line by a driver.

SUMMARY OF THE INVENTION

An object of the invention is to provide a low-power data transfer circuit having a high data transfer rate.

A data transfer circuit, includes: three data signal lines; a first selection circuit for selecting two data signal lines having first and second potentials which are complementary to each other for transmitting data, out of the three data signal lines and for precharging a non-selected data signal line to the first potential; and a second selection circuit for selectively and electrically connecting the two data signal lines selected by the first selection circuit out of the three data signal lines to a reception side circuit, and the first selection circuit includes a driver circuit provided corresponding to each of the three data signal lines and connected between the first and third potentials and the second potential is set to a level between the first and third potentials.

By using two out of three data transfer lines to transfer data and precharging the remaining one data transfer line while data is transferred, data transfer can be performed efficiently and maintaining one of potentials of the selected two data transfer lines at a first potential as a potential for precharging and setting the other potential to a second potential between a third potential (for example, ground potential GND) and the first potential, power consumption to precharge the data transfer line to the first potential can be reduced.

Preferably, the first selection circuit selects two data signal lines of same potential levels out of the three data signal lines, on the basis of the potentials of predetermined two data signal lines out of the three data signal lines.

A data transfer line to be selected next can be selected based on the potentials of two data transfer lines out of the three data transfer lines. Consequently, it is unnecessary to supply a selection signal from the outside, and the number of components can be reduced.

Preferably, the second selection circuit includes an amplifying circuit for amplifying a potential difference between the two data signal lines selected by the first selection circuit out of the three data signal lines, and on the basis of the potential difference amplified by the amplifying circuit, selectively and electrically connects the two data signal lines selected by the first selection circuit to the reception side circuit.

The data transfer lines used for data transfer out of the three data transfer lines can be selected by a potential difference of the two data transfer lines. Thus, it is unnecessary to supply a selection signal from the outside, and the number of components can be reduced.

Preferably, the data transfer circuit further includes a latching circuit for holding the potentials of predetermined two data signal lines out of the three data signal lines as binary data; and the first selection circuit selects two data signal lines out of the three data signal lines on the basis of the binary data held by the latching circuit.

Particularly the first selection circuit includes a logic control section for selecting two data signal lines out of the three data signal lines and selecting one of the first potential and third potential supplied by the potential supply source to each of the three data signal lines.

Particularly the driver circuit is activated in response to a driver enable signal, and the second potential is set in accordance with an active period of the driver enable signal.

The semiconductor integrated circuit includes: a memory cell array having a plurality of memory cells arranged in a matrix; an input/output control circuit for outputting data held in a selected memory cell designated on the basis of an address signal out of the memory cell; a data buffer circuit for outputting a reading data read from the input/output control circuit to an external output-terminal a data transfer circuit placed between the input/output control circuit and the data buffer circuit and for transmitting the reading data to the data buffer circuit a first input/output line for transmitting the reading data from the input/output control circuit to the data transfer circuit and a second input/output line for transmitting the reading data from the data transfer circuit to the data buffer circuit, and the data transfer circuit includes; three data signal lines are longer than the first and second input/output line; a first selection circuit for selecting two data signal lines whose potentials change to first and second potentials which are complementary to each other in accordance with the data to be transmitted out of the three data signal lines and for precharging a non-selected data signal line to the first potential; a second selection circuit for selectively and electrically connecting the two data signal lines selected by the first selection circuit out of the three data signal lines to a reception side circuit; and the first selection circuit having a driver circuit provided corresponding to each of the three data signal lines and connected between the first potential and third potential and the logic control section for selecting two data signal lines out of the three data signal lines in conjunction with selecting one of the first potential and third potential supplied by the potential supply source to each of the three data signal lines and the driver circuit activates on the basis of a driver enable signal, and the second potential is set by a period of time during supplying the driver enable signal the second selection circuit having an amplifying circuit for amplifying a potential difference between the two data signal lines selected by the first selection circuit out of the three data signal lines, and on the basis of the potential difference amplified by the amplifying circuit, selectively and electrically connects the two data signal lines having selected by the first selection circuit to the second input/output line.

The semiconductor integrated circuit of the invention uses two out of three data transfer lines to transfer data and precharges the remaining one data transfer line while data is transferred, thereby enabling data transfer to be performed efficiently and by maintaining one of potentials of the selected two data transfer lines at a first potential as a potential for precharging and setting the other potential to a second potential between a third potential (for example, ground potential GND) and the first potential, power consumption to precharge the data transfer line to the first potential can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
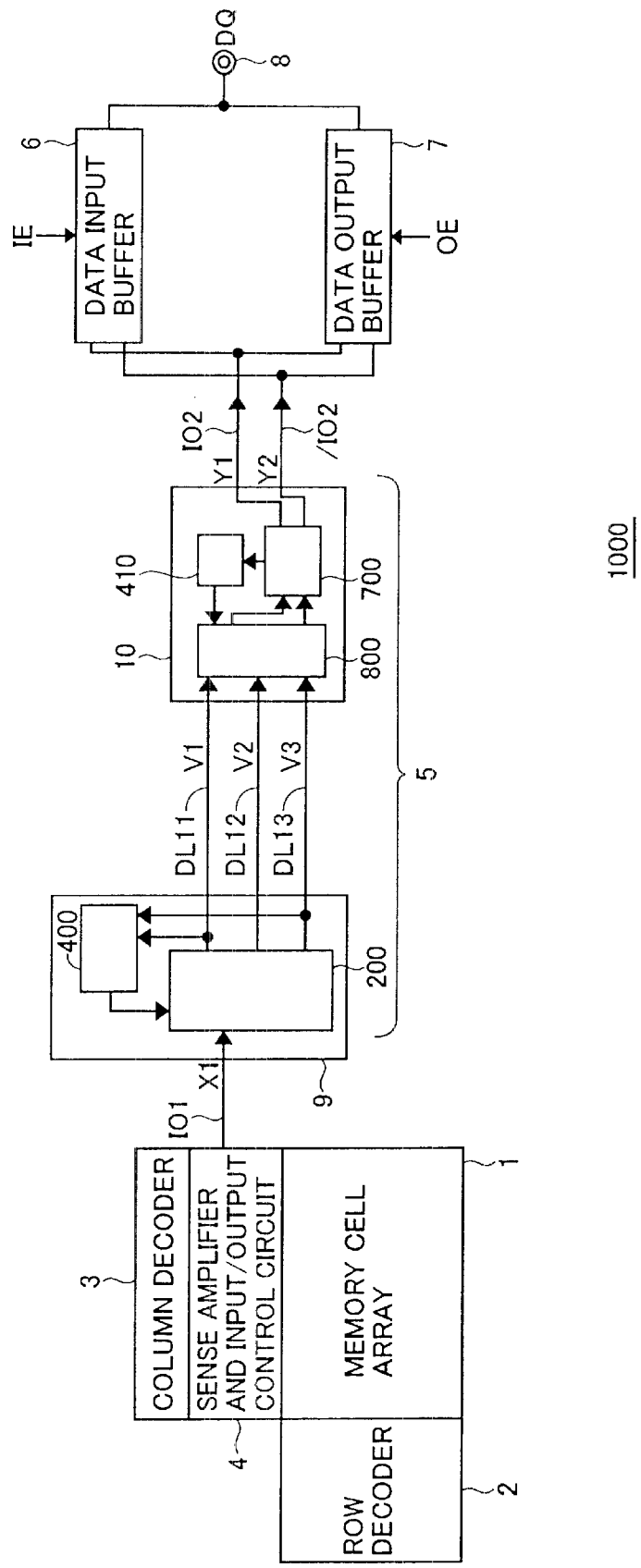
FIG. 1 is a diagram showing a general configuration of a DRAM 1000 according to an embodiment of the invention.

An embodiment of the invention will be described in detail hereinbelow with reference to the drawings. The same or corresponding components in the drawings are designated by the same reference numeral and their description will not be repeated.

FIG. 1 is a diagram showing a general configuration of a dynamic random access memory 1000 (hereinbelow, abbreviated as a DRAM) according to an embodiment of the invention.

Referring to FIG. 1, DRAM 1000 includes a memory cell array 1, a row decoder 2, a column decoder 3, a sense amplifier and input/output control circuit 4, data input/output lines IO1, IO2 and /IO2, a data transfer circuit 5, a data input buffer 6, a data output buffer 7, and a data input/output terminal 8.

Memory cell array 1 includes a plurality of memory cells arranged in a matrix. A peculiar address is pre-assigned to each memory cell. Each memory cell stores data of one bit.

Row decoder 2 designates a row address in memory cell array 1 in accordance with a row address signal supplied from the outside.

Column decoder 3 designates a column address in memory cell array 1 in accordance with a column address signal supplied from the outside.

Sense amplifier and input/output control circuit 4 reads data of a memory cell designated by row decoder 2 and column decoder 3 and sends it onto data input/output line IO1.

Data transfer circuit 5 transfers the data read and sent to data input/output line IO1 to data input/output lines IO2 and /IO2 in reading operation.

A data transfer circuit for writing operation is also disposed to transfer data given as a potential difference between data input/output lines IO2 and /IO2, that is, a difference between a potential Y1 of data input/output line IO2 and a potential Y2 of data input/output line IO2 to data input/output line IO1 in writing operation. The data transfer circuits for reading and writing operation are similar to each other except for the data transfer direction, and the configuration and operation will be described in detail hereinlater.

In writing operation, data input buffer 6 outputs data supplied from the outside via data input/output terminal 8 to data input/output lines IO2 and /IO2 in response to an input permit signal IE. In reading operation, data read and sent on the data input/output lines IO2 and /IO2 is output to data input/output terminal 8 in response to an output permit signal OE.

The configuration and operation of data transfer circuit 5 will now be described in detail.

Data transfer circuit 5 includes a transmission control circuit 9, a reception control circuit 10, and data transfer lines DL11 to DL13.

Data is input from sense amplifier and input/output circuit 4 via data input/output line IO1 to transmission control circuit 9. Transmission control circuit 9 compares potentials V1 to V3 on data transfer lines DL11 to DL13, selects and connects two data transfer lines having the same potential ( "H" level), for example, DL1 and DL3 to the data input/output line IO1, and precharges the remaining one data transfer line to the "H" level.

Transmission control circuit 9 includes a transmission selecting circuit 200 and a data latch circuit 400.

Figure 2:
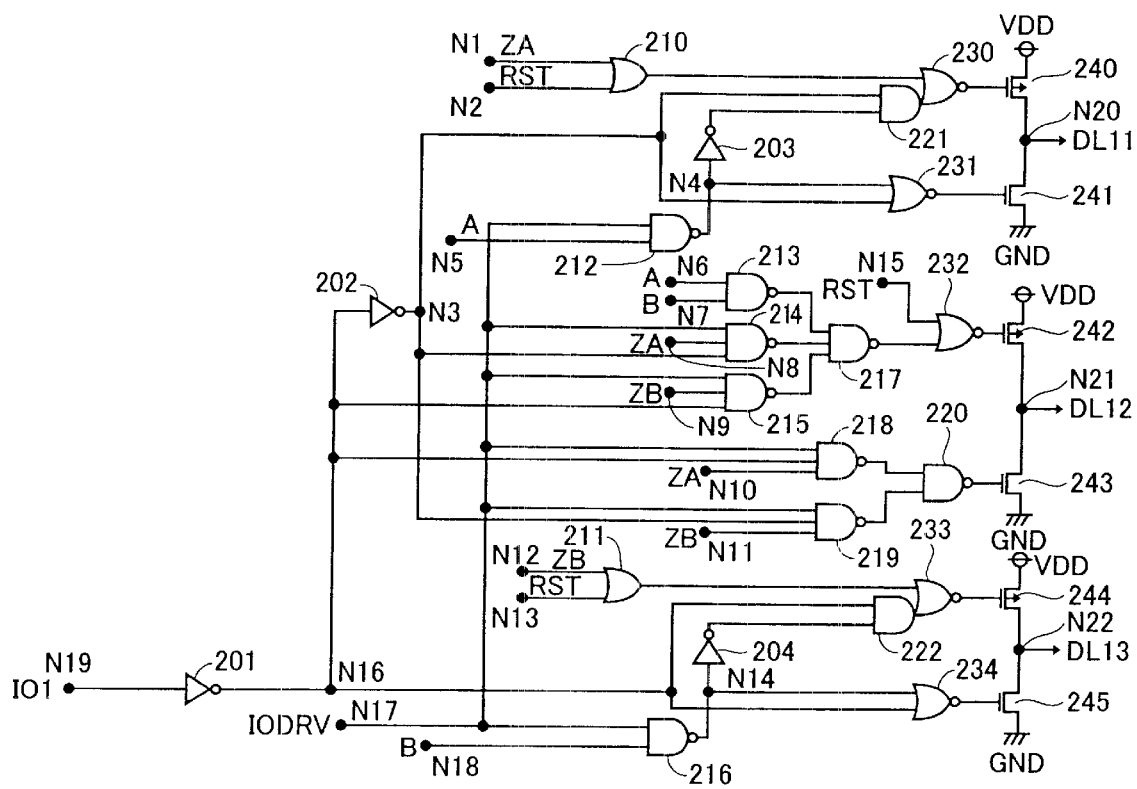
FIG. 2 is a diagram showing the circuit configuration of a transmission selecting circuit 200.

Referring to FIG. 2, transmission selecting circuit 200 selects two data transfer lines out of data transfer lines DL11 to DL13 for transferring data on data input/output line IO1 in accordance with a transmission selection signal as an output signal of data latch circuit 400. Via the selected data transfer lines, the data on data input/output line IO1 is transmitted to reception control circuit 10.

Referring to FIG. 2, transmission selecting circuit 200 includes inverters 201 to 204, OR circuits 210 and 211, NAND circuits 212 to 220, AND circuits 221 and 222, NOR circuits 230 to 234, P-channel MOS transistors 240, 242, and 244, and N-channel MOS transistors 241, 243, and 245.

P-channel MOS transistor 240 is connected between a source voltage VDD and a node N20. N-channel MOS transistor 241 is connected between node N20 and a ground voltage GND. Node N20 is connected to data transfer line DL11.

P-channel MOS transistor 242 is connected between source voltage VDD and a node N21. N-channel MOS transistor 243 is connected between node N21 and ground voltage GND. Node N21 is connected to data transfer line DL12.

P-channel MOS transistor 244 is connected between source voltage VDD and a node N22. N-channel MOS transistor 245 is connected between node N22 and ground voltage GND. Node N22 is connected to data transfer line DL13.

NAND circuit 216 receives inputs of nodes N17 and N18 and outputs a result of NAND logical operation to a node N14. NOR circuit 234 receives inputs of node N14 and a node N16 and transmits a result of NOR logical operation to the gate electrode of N-channel MOS transistor 245.

Inverter 201 receives a signal from a node N19 and transmits an inversion signal of the received signal to node N16. AND circuit 222 receives an input from node N16 and an input from node N14 via inverter 204 and transmits a result of AND logical operation to the input side of NAND circuit 233. OR circuit 211 receives inputs from nodes N12 and N13 and transmits a result of OR logical operation to the input side of NOR circuit 233. NOR circuit 233 receives an output signal of OR circuit 211 and an output signal of AND circuit 222 and transmits a result of NOR logical operation to the gate electrode of P-channel MOS transistor 244.

Inverter 202 receives a signal from node N16 and transmits an inversion signal of the received signal to a node N3. NAND circuit 219 receives inputs of nodes N11, N3, and N17 and transmits a result of NAND logical operation to the input side of NAND circuit 220. NAND circuit 218 receives inputs of nodes N10, N16, and N17 and transmits a result of NAND logical operation to the input side of NAND circuit 220. NAND circuit 220 receives output signals of NAND circuits 218 and 219 and transmits a result of NAND logical operation to the gate electrode of N-channel MOS transistor 243.

NAND circuit 215 receives inputs of nodes N16, N9, and N17 and transmits a result of NAND logical operation to the input side of NAND circuit 217. NAND circuit 214 receives inputs of nodes N3, N8, and N17 and transmits a result of NAND logical operation to the input side of NAND circuit 217. NAND circuit 213 receives inputs of nodes N7 and N6 and transmits a result of NAND logical operation to the input side of NAND circuit 217. NAND circuit 217 receives output signals of NAND circuits 213 to 215 and transmits a result of NAND logical operation to the input side of NOR circuit 232. NOR circuit 232 receives an input of a node N15 and an output signal of NAND circuit 217 and transmits a result of NOR logical operation to the gate electrode of P-channel MOS transistor 242.

NAND circuit 212 receives inputs of nodes N5 and N17 and outputs a result of NAND logical operation to a node N4. NOR circuit 231 receives inputs of nodes N4 and N3 and transmits a result of NOR logical operation to the gate electrode of N-channel MOS transistor 241.

AND circuit 221 receives an input of node N3 and an input of node N4 via inverter 203 and transmits a result of AND logical operation to the input side of NOR circuit 230. OR circuit 210 receives inputs of nodes N1 and N2 and transmits a result of OR logical operation to the input side of NOR circuit 230. NOR circuit 230 receives output signals of OR circuit 210 and AND circuit 221 and transmits a result of NOR logical operation to the gate electrode of P-channel MOS transistor 240.

A signal on data input/output line IO1 is transmitted to node N19.

A transmission selection signal ZA is input to nodes N1, N8, and N10.

A reset signal RST is input to nodes N2, N13, and N15.

A transmission selection signal A is input to nodes N5 and N6.

A transmission selection signal B is input to nodes N7 and N18.

A transmission selection signal ZB is input to nodes N9, N11, and N12.

An activate signal IODRV of transmission selecting circuit 200 is input to node N17.

In transmission selecting circuit 200, when activate signal IODRV is in the "L" level state, N-channel MOS transistors 241, 243, and 245 for driving are non-conducting.

In transmission selecting circuit 200, when activate signal IODRV is at the "L" level and reset signal RST is at the "H" level, irrespective of the states of transmission selection signals A, ZA, B, and ZB, P-channel MOS transistors are made conductive to precharge data transfer lines DL11 to DL13 to the "H" level.

Figure 3:
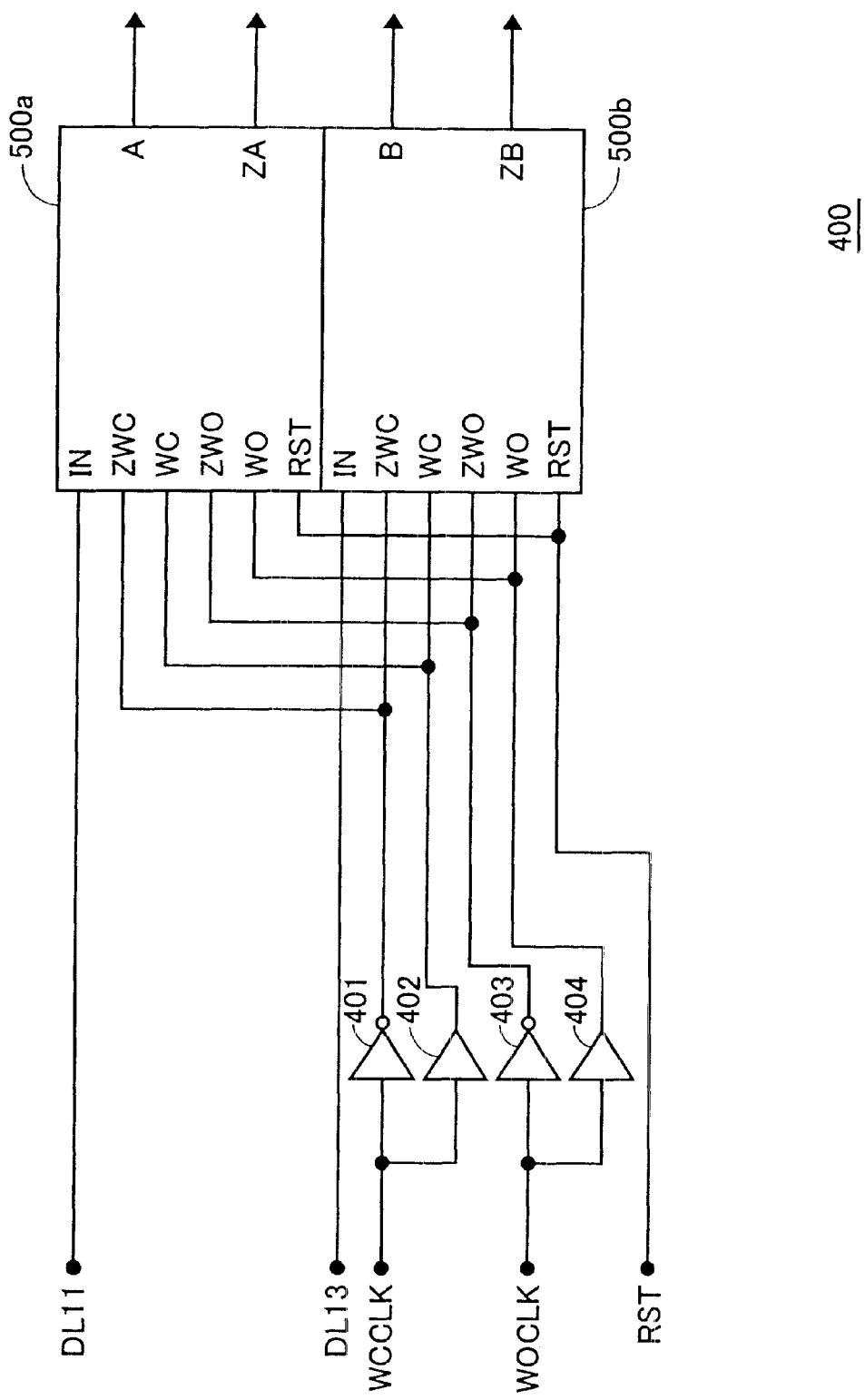
FIG. 3 is a diagram showing a data latch circuit 400.

Referring to FIG. 3, data latch circuit 400 is a circuit for latching potentials on data transfer lines DL11 and DL13 and generating transmission selection signals A, ZA, B, and ZB for selecting data transfer lines DL11 to DL13 in transmission selecting circuit 200.

Data latch circuit 400 includes: a latch circuit 500a for receiving data transfer line DL11, a transmission data input control signal WCCLK, a transmission data output control signal WOCLK, and a reset signal RST and generating transmission selection signals A and ZA; and a latch circuit 500b for receiving data transfer line DL13, transmission data input control signal WCCLK, transmission data output control signal WOCLK, and reset signal RST and generating transmission selection signals B and ZB.

Transmission data input control signal WCCLK is input as control signals ZWC and WC to each of latch circuits 500a and 500b via an inverter 401 and a transistor 402.

Transmission data output control signal WOCLK is input as control signals ZWO and WO to each of latch circuits 500a and 500b via an inverter 403 and a transistor 404.

Figure 4:
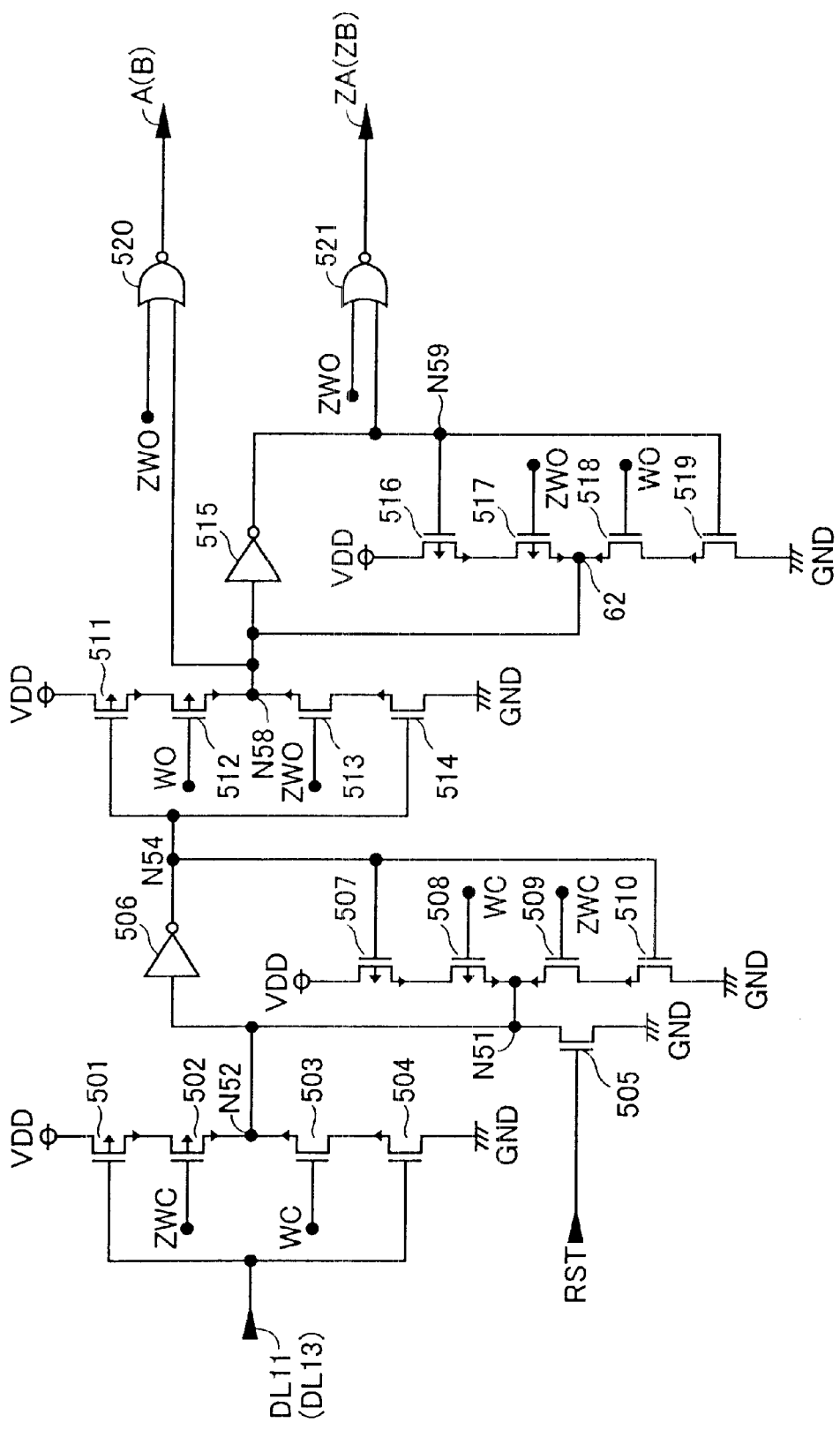
FIG. 4 is a diagram showing the circuit configuration of latch circuits 500a and 500b.

Referring to FIG. 4, latch circuit 500 includes P-channel MOS transistors 501, 502, 507, 508, 511, 512, 516, and 517, N-channel MOS transistors 503, 504, 505, 509, 510, 513, 514, 518, and 519, inverters 506 and 515, and NOR circuits 520 and 521.

P-channel MOS transistors 501 and 502 are connected in series between the source voltage VDD and a node N52. The gate electrode of P-channel MOS transistor 501 is connected to data transfer line DL11 (DL13). The gate electrode of P-channel MOS transistor 502 receives control signal ZWC.

N-channel MOS transistors 503 and 504 are connected in series between node N52 and ground voltage GND. The gate electrode of N-channel MOS transistor 503 receives control signal WC. The gate electrode of N-channel MOS transistor 504 is connected to data transfer line DL11 (DL13).

Inverter 506 is an inverter having a certain capacity, which receives an input of node N52 and outputs an inversion signal of the input to a node N54. P-channel MOS transistors 507 and 508 are connected in series between source voltage VDD and a node N51. The gate electrode of P-channel MOS transistor 507 receives an input of a node N54. The gate electrode of P-channel MOS transistor 508 receives control signal WC.

N-channel MOS transistors 509 and 510 are connected in series between node N51 and ground voltage GND. The gate electrode of N-channel MOS transistor 509 receives control signal ZWC. The gate electrode of N-channel MOS transistor 510 receives an input of node N54.

N-channel MOS transistor 505 is connected between node N51 and ground voltage GND. The gate electrode of N-channel MOS transistor 505 receives reset signal RST. Nodes N51 and N52 are electrically coupled to each other.

P-channel MOS transistors 511 and 512 are connected in series between source voltage VDD and a node N58. The gate electrode of P-channel MOS transistor 511 receives an input of node N54. The gate electrode of P-channel MOS transistor 512 receives control signal WO.

N-channel MOS transistors 513 and 514 are connected in series between node N58 and ground voltage GND. The gate electrode of N-channel MOS transistor 513 receives control signal ZWO. The gate electrode of N-channel MOS transistor 514 receives an input of node N54.

NOR circuit 520 receives control signal ZWO and an input of node N58 and generates a result of NOR logical operation as a transmission selection signal A (B).

Inverter 515 is an inverter having a predetermined capacity, which receives an input of node N58 and transmits an inversion signal of the input to a node N59. NOR circuit 521 receives control signal ZWO and an input of node N59 and generates a result of NOR logical operation as a transmission selection signal ZA (ZB).

P-channel MOS transistors 516 and 517 are connected in series between source voltage VDD and a node N62. The gate electrode of P-channel MOS transistor 516 receives an input of node N59. The gate electrode of P-channel MOS transistor 517 receives control signal ZWO.

N-channel MOS transistors 518 and 519 are connected in series between node N62 and ground voltage GND. The gate electrode of N-channel MOS transistor 518 receives control signal WO. The gate electrode of N-channel MOS transistor 519 receives an input of node N59. Nodes N62 and N58 are electrically coupled to each other.

Latch circuit 500a receives a signal of data transfer line DL11 and outputs transmission selection signals A (B) and ZA (ZB).

Latch circuit 500b receives a signal of data transfer line DL13 and outputs transmission selection signals B and ZB.

The operation of data latch circuit 400 will be described.

In data latch circuit 400, when transmission data input control signal WCCLK is at the "H" level, signals on data transfer lines DL11 and DL13 are input to latch circuits 500a and 500b, respectively. A signal supplied when transmission data input control signal WCCLK goes low ("L" level) is latched.

By data latched when transmission data output control signal WOCLK goes high ("H" level), data latch circuit 400 generates transmission selection signals A, ZA, B, and ZB.

When transmission data output control signal WOCLK is at the "L" level, all transmission selection signals A, ZA, B, and ZB are at the "L" level.

Transmission selection signals A and ZA outputted when data transfer line DL11 is at the "L" level will be described as an example.

Referring again to FIG. 4, when data transfer line DL11 is at the "L" level and transmission data input control signal WCCLK changes from the "H" level to the "L" level, data is latched and node N52 is latched at the "H" level.

When transmission data output control signal WOCLK is at the "L" level, therefore, both transmission selection signals A and ZA are at the "L" level. When transmission data output control signal WOCLK is at the "H" level, transmission selection signals A and ZA are at the "L" and "H" levels, respectively.

When it is determined from the latched data that data transfer line DL11 is used for data transfer, data latch circuit 400 changes transmission selection signal A to the "H" level and transmission selection signal ZA to the "L" level. On the other hand, when it is determined that data transfer line DL11 is not used, data latch circuit 400 changes output A to the "L" level and changes output ZA to the "H" level. In an initial state where no data transfer line is used, transmission selection signals A and ZA are at the "L" level.

Similarly, when it is determined from latched data that data transfer line DL13 is used for data transfer, data latch circuit 400 changes transmission selection signal B to the "H" level and changes transmission selection signal ZB to the "L" level. On the contrary, when it is determined that no data transfer line DL13 is used, data latch circuit 400 changes transmission selection signal B to the "L" level and changes transmission selection signal ZB to the "H" level. In an initial state where no data transfer line is used, transmission selection signal B and ZB are at the "L" level.

The operation of transmission control circuit 9 will now be described.

As an example, a case of selecting data transfer lines DL11 and DL13 and transferring data of data input/output line IO1 which is at the L level will be described.

It is now assumed that data is already latched by transmission data input control signal WCCLK. Since data transfer lines DL11 and DL13 are selected in this case, transmission selection signals A, ZA, B, and ZB are at the "H", "L", "H", and "L" levels, respectively.

Since P-channel MOS transistor 242 is turned on, data transfer line DL12 is connected to source voltage VDD and precharging is started.

When activate signal IODRV goes high ("H" level), since data input/output line IO1 is at the "L" level, N-channel MOS transistor 241 and P-channel MOS transistor 245 are turned on. On the other hand, P-channel MOS transistor 240 and N-channel MOS transistor 245 are turned off.

Therefore, data transfer line DL11 is connected to ground voltage GND, and the voltage drops to the "L" level. On the other hand, since data transfer line DL13 is connected to source voltage VDD, the "H" level is maintained.

In such a manner, the "L" level data of data input/output line IO1 is transferred via two data transfer lines DL11 and DL13 to reception control circuit 10. Data transfer line DL12 which is not used for data transmission is precharged.

When the level ("H" or "L") of the potential on the transmission side of each of data transfer lines DL11 to DL13 becomes to be determined in a logical circuit, data latch circuit 400 sets WCCLK to the "H" level.

At this time, the potentials of data transfer lines DL11 and DL13 are input to data latch circuit 400. Based on data read by data latch circuit 400 at this time, a data transfer line to be used at the next data transfer is selected.

Reception control circuit 10 on the data reception side will now be described.

Referring again to FIG. 1, reception control circuit 10 receives data transmitted from transmission control circuit 9 via two transfer lines selected from data transfer lines DL11 to DL13. Reception control circuit 10 is connected to data input buffer 6 and data output buffer 7 via data input/output lines IO2 and /IO2, and outputs received data to data output buffer 7.

Reception control circuit 10 includes a data latch circuit 410, an amplifying circuit 700, and a reception selecting circuit 800.

Figure 5:
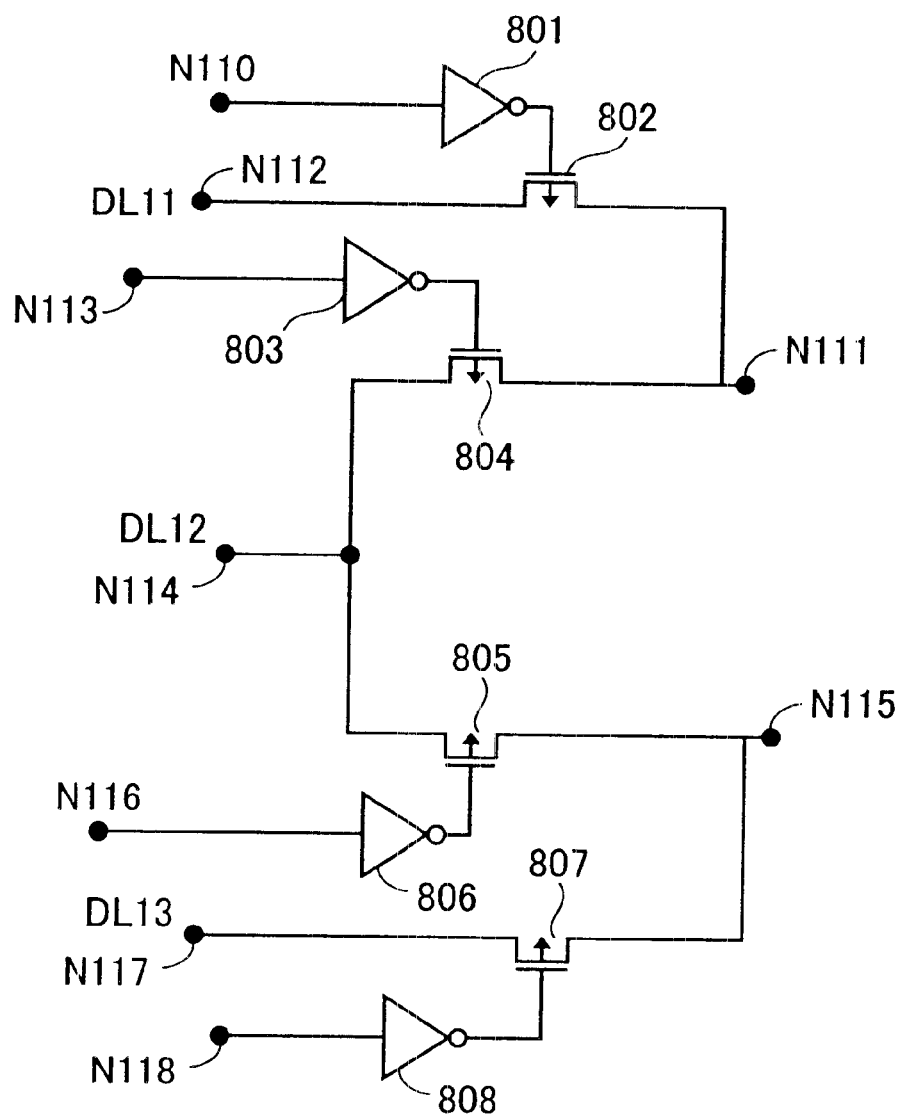
FIG. 5 is a diagram showing the circuit configuration of a reception selecting circuit 800.

Referring to FIG. 5, reception selecting circuit 800 is a circuit to be connected to amplifying circuit 700 via a data transfer line selected according to a reception selection signal output from data latch circuit 410.

Referring to FIG. 5, reception selecting circuit 800 includes inverters 801, 803, 806, and 808 and P-channel MOS transistors 802, 804, 805, and 807.

P-channel MOS transistor 802 is connected between nodes N112 and N111. The gate electrode of P-channel MOS transistor 802 receives an input of a node N110 via inverter 801.

N-channel MOS transistor 804 is connected between nodes N114 and N111. The gate electrode of N-channel MOS transistor 804 receives an input of a node N113 via inverter 803.

P-channel MOS transistor 805 is connected between nodes N114 and N115. The gate electrode of P-channel MOS transistor 805 receives an input of a node N116 via inverter 806.

P-channel MOS transistor 807 is connected between nodes N117 and N115. The gate electrode of P-channel MOS transistor 807 receives an input of a node N118 via inverter 808.

Nodes N112, N114, and N117 are connected to data transfer lines DL11, DL12, and DL13, respectively.

Figure 6:
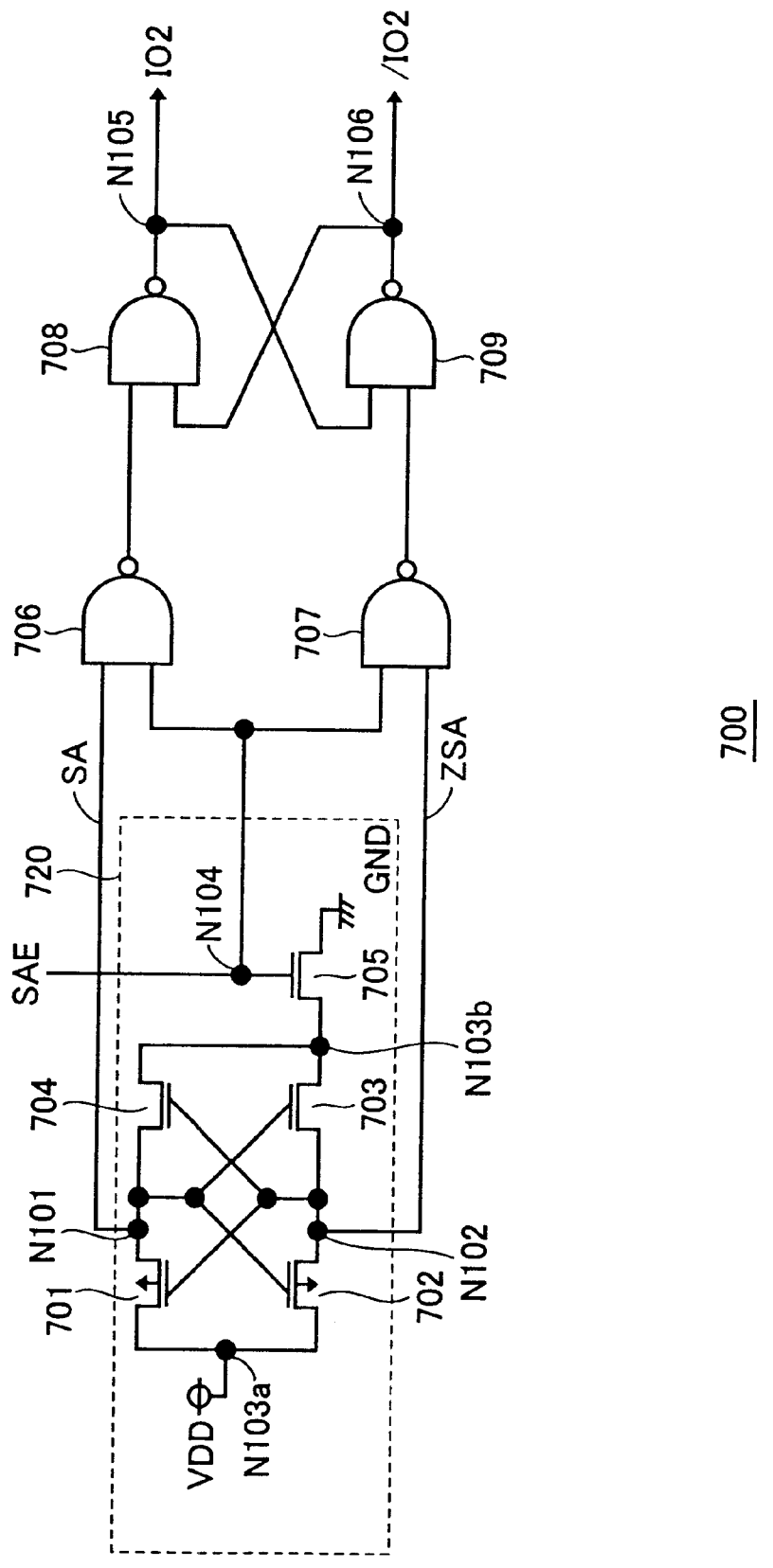
FIG. 6 is a diagram showing the circuit configuration of an amplifying circuit 700.

Referring to FIG. 6, since each data transfer line has a predetermined capacity, it is difficult to detect whether a signal output from reception selecting circuit 800 is at the "H" level or "L" level. Consequently, amplifying circuit 700 amplifies a level difference of signals output from reception selecting circuit 800 by a sense amplifier 720 and outputs an amplified signal to data input/output lines IO2 and /IO2.

Amplifying circuit 700 includes sense amplifier 720 constructed by P-channel MOS transistors 701 and 702 and N-channel MOS transistors 703 to 705, and NAND circuits 706 to 709.

Source voltage VDD is connected to a node N103a.

P-channel MOS transistor 701 is connected between node N103a and a node N101. N-channel MOS transistor 704 is connected between node N101 and a node N103. Both the gate electrode of P-channel MOS transistor 701 and that of N-channel MOS transistor 704 receive an input of a node N102.

P-channel MOS transistor 702 is connected between nodes N103a and N102. N-channel MOS transistor 703 is connected between nodes N102 and N103b. Both the gate electrode of P-channel MOS transistor 702 and that of N-channel MOS transistor 703 receive an input of node N101.

N-channel MOS transistor 705 is connected between node N103b and ground voltage GND. The gate electrode of N-channel MOS transistor 705 receives an input of a node N104.

NAND circuit 706 receives inputs of nodes N101 and N104 and transmits a result of NAND logical operation to the input side of NAND circuit 708.

NAND circuit 707 receives inputs of nodes N104 and N102 and transmits a result of NAND logical operation to the input side of NAND circuit 709.

NAND circuit 708 receives an output signal of NAND circuit 706 and an input of a node N106 and transmits a result of NAND logical operation to a node N105.

NAND circuit 709 receives an input of node N105 and an output signal of NAND circuit 707 and outputs a result of NAND logical operation to node N106.

Nodes N105 and N106 are connected to data input/output lines IO2 and /IO2, respectively.

Nodes N101 and N102 are connected to output nodes N111 and N115 of reception selecting circuit 800, respectively.

Sense amplifier 720 is activated by a sense amplifier activate signal SAE. Sense amplifier activate signal SAE is input to node N104.

In sense amplifier 720, when node N101 is at the "H" level, node N102 is at the "L" level. Consequently, by an amplifying action of sense amplifier 720, an output signal SA is charged by source voltage VDD, and the potential of an output signal ZSA is further decreased by ground voltage GND.

Figure 7:
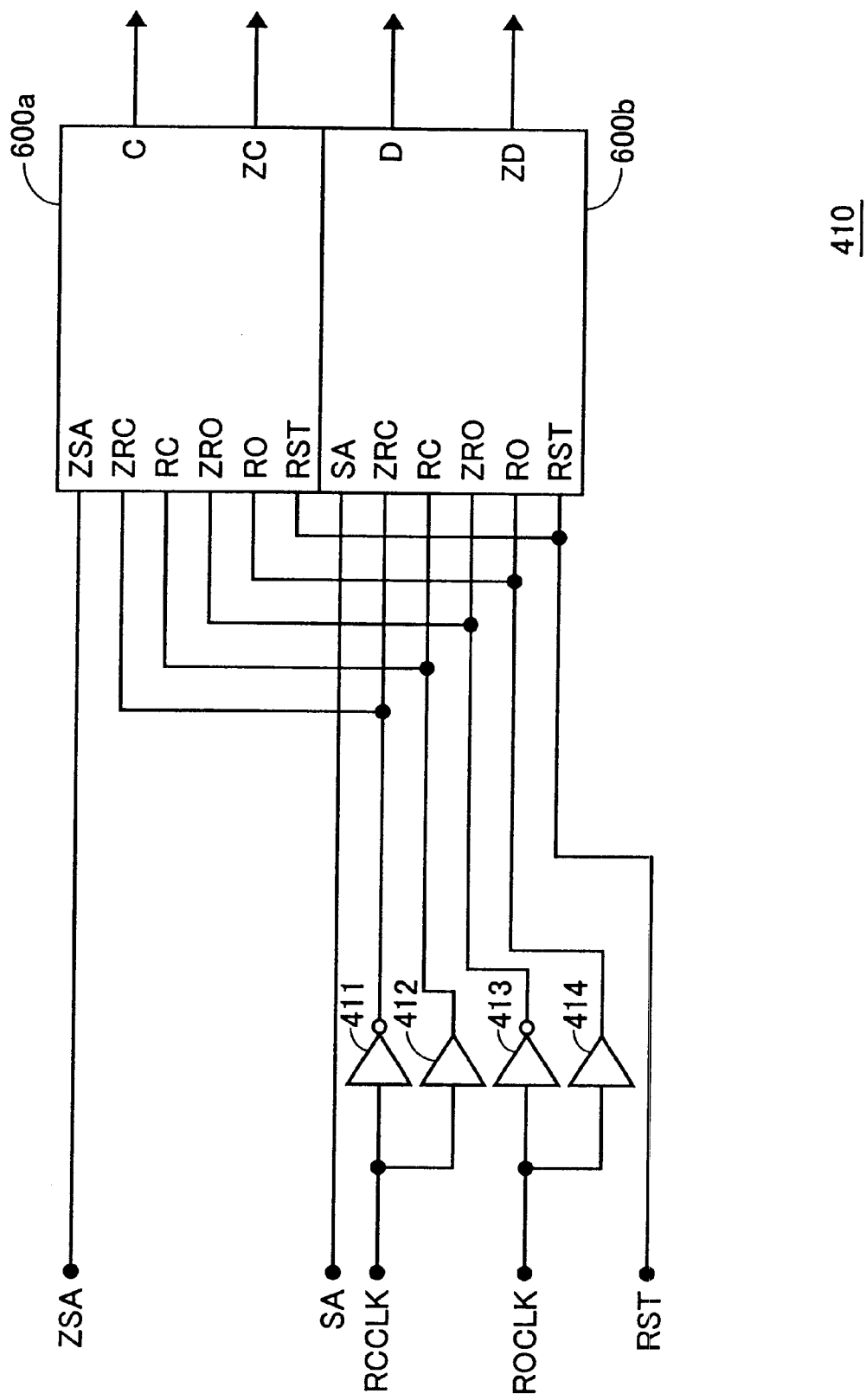
FIG. 7 is a diagram showing a data latch circuit 410.

Referring to FIG. 7, data latch circuit 410 latches signal SA of node N101 amplified by sense amplifier 720 included in amplifying circuit 700 and signal ZSA as a signal of node N102, and generates a reception selection signal by which reception selecting circuit 800 selects a data transfer line.

Data latch circuit 410 includes: a latch circuit 600a for receiving signal ZSA, a reception data input control signal RCCLK, a reception data output control signal ROCLK, and reset signal RST and generating reception selection signals C and ZC; and a latch circuit 600b for receiving signal SA, reception data input control signal RCCLK, reception data output control signal ROCLK, and reset signal RST and generating reception selection signals D and ZD.

Reception data input control signal RCCLK is input as control signals ZRC and RC to each of latch circuits 600a and 600b via an inverter 411 and a transistor 412.

Reception data output control signal ROCLK is input as control signals ZRO and RO to each of latch circuits 600a and 600b via an inverter 413 and a transistor 414.

Figure 8:
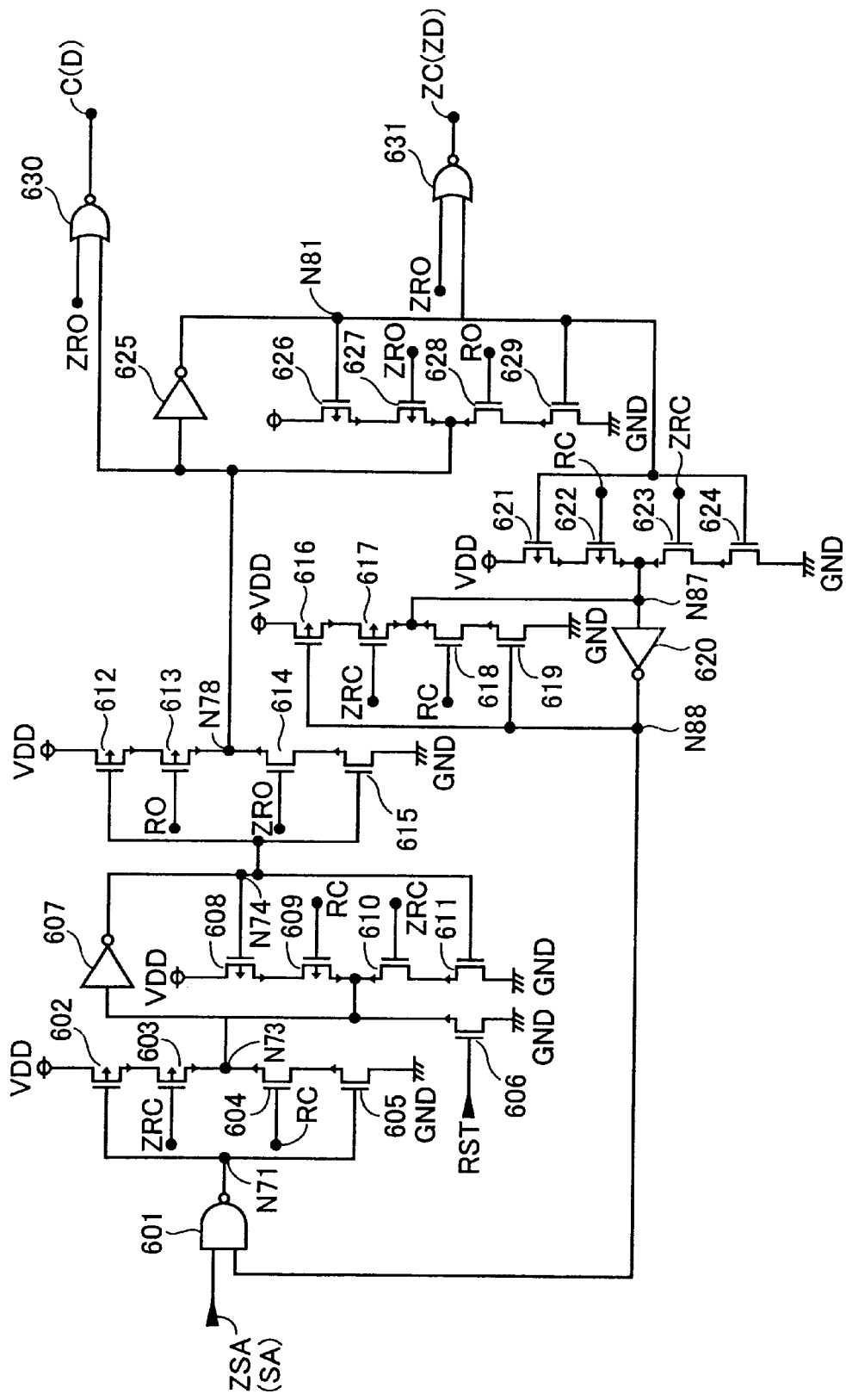
FIG. 8 is a diagram showing a circuit configuration of a latch circuit 600.

Referring to FIG. 8, latch circuit 600 includes an NAND circuit 601, P-channel MOS transistors 602, 603, 608, 609, 612, 613, 616, 617, 621, 622, 626, and 627, N-channel MOS transistors 604, 605, 606, 610, 611, 614, 615, 618, 619, 623, 624, 628, and 629, inverters 607, 620, and 625, and NOR circuits 630 and 631.

NAND circuit 601 receives control signal ZSA (SA) and an input of a node N88 and outputs a result of NAND logical operation to a node N71.

P-channel MOS transistors 602 and 603 are connected in series between the source voltage VDD and a node N73. The gate electrode of P-channel MOS transistor 602 receives an input of node N71. The gate electrode of P-channel MOS transistor 603 receives control signal ZRC.

N-channel MOS transistors 604 and 605 are connected in series between node N73 and ground voltage GND. The gate electrode of N-channel MOS transistor 604 receives control signal RC. The gate electrode of N-channel MOS transistor 605 receives an input of node N71.

Inverter 607 is an inverter having a predetermined capacity, which receives an input of node N73 and outputs an inversion signal of the input to a node N74.

P-channel MOS transistors 608 and 609 are connected in series between source voltage VDD and node N73. The gate electrode of P-channel MOS transistor 608 receives an input of node N74. The gate electrode of P-channel MOS transistor 609 receives control signal RC.

N-channel MOS transistors 610 and 611 are connected in series between node N73 and ground voltage GND. The gate electrode of N-channel MOS transistor 610 receives control signal ZRC. The gate electrode of N-channel MOS transistor 611 receives an input of node N74.

N-channel MOS transistor 606 is connected between node N73 and ground voltage GND. The gate electrode of N-channel MOS transistor 606 receives reset signal RST.

P-channel MOS transistors 612 and 613 are connected in series between source voltage VDD and a node N78. The gate electrode of P-channel MOS transistor 612 receives an input of node N74. The gate electrode of P-channel MOS transistor 613 receives control signal RO.

N-channel MOS transistors 614 and 615 are connected in series between node N78 and ground voltage GND. The gate electrode of N-channel MOS transistor 614 receives control signal ZRO. The gate electrode of N-channel MOS transistor 615 receives an input of node N74.

NOR circuit 630 receives control signal ZRO and an input of node N78 and generates a result of NOR logical operation as a reception selection control signal C (D).

Inverter 625 is an inverter having a predetermined capacity, which receives an input of node N78 and outputs an inversion signal of the input to node a N81.

P-channel MOS transistors 626 and 627 are connected in series between source voltage VDD and node N78. The gate electrode of P-channel MOS transistor 626 receives an input of node N81. The gate electrode of P-channel MOS transistor 627 receives control signal ZRO.

N-channel MOS transistors 628 and 629 are connected in series between node N78 and ground voltage GND. The gate electrode of N-channel MOS transistor 628 receives control signal RO. The gate electrode of N-channel MOS transistor 629 receives an input of node N81. NOR circuit 631 receives control signal ZRO and an input of node N81 and generates reception selection control signal ZC (ZD).

P-channel MOS transistors 621 and 622 are connected in series between source voltage VDD and a node N87. The gate electrode of P-channel MOS transistor 621 receives an input of node N81. The gate electrode of P-channel MOS transistor 622 receives control signal RC.

N-channel MOS transistors 623 and 624 are connected in series between node N87 and ground voltage GND. The gate electrode of N-channel MOS transistor 623 receives control signal ZRC. The gate electrode of N-channel MOS transistor 624 receives an input of node N81.

Inverter 620 is an inverter having a predetermined capacity, which receives an input from node N81 and outputs an inversion signal of the input to node N88.

P-channel MOS transistors 616 and 617 are connected in series between source voltage VDD and node N87. The gate electrode of P-channel MOS transistor 616 receives an input of node N88. The gate electrode of P-channel MOS transistor 617 receives control signal ZRC.

N-channel MOS transistors 618 and 619 are connected in series between node N87 and ground voltage GND. The gate electrode of N-channel MOS transistor 618 receives control signal RC. The gate electrode of N-channel MOS transistor 619 receives an input of node N88.

Latch circuit 600a receives signal ZSA of node N102 of sense amplifier 720 and outputs reception selection signals C and ZC.

Latch circuit 600b receives signal SA of node N101 of sense amplifier 720 and outputs reception selection signals D and ZD.

Reception selection control signals C, ZC, D, and ZD are input to nodes N110, N113, N118, and N116 of reception selecting circuit 800, respectively.

The operation of data latch circuit 410 will be described.

In data latch circuit 410, when reception data input control signal RCCLK is at the "H" level, output signals ZSA and SA of sense amplifier 720 are input to each of latch circuits 600a and 600b. A signal supplied when reception data input control signal RCCLK goes low ("L" level) is latched.

By data latched when reception data output control signal ROCLK goes high ("H" level), data latch circuit 410 outputs reception selection signals C, ZC, D, and ZD. When reception data output control signal ROCLK is at the "L" level, all reception selection signals C, ZC, D, and ZD at the "L" level are output.

Reception selection signals C and ZC outputted when output signal ZSA of sense amplifier 720 is at the "L" level will be described as an example.

Referring again to FIG. 8, when output signal ZSA of sense amplifier 720 is at the "L" level and reception data input control signal RCCLK changes from the "H" level to the "L" level, data is latched and node N74 is latched at the "H" level.

When reception data output control signal WOCLK is at the "L" level, therefore, both reception selection signals C and ZC are at the "L" level. When transmission data output control signal WOCLK is at the "H" level, reception selection signals C and ZC are at the "H" and "L" levels, respectively.

When it is determined from the latched data that data transfer line DL11 is used for data transfer, data latch circuit 410 changes output C to the "H" level and output ZC to the "L" level.

When it is determined from the latched data that data transfer line DL12 is used, data latch circuit 410 changes reception selection signal C to the "L" level, changes reception selection signal ZC to the "H" level or changes reception selection signal D to the "L" level, and changes reception selection signal ZD to the "H" level.

Similarly, when it is determined from the latched data that data transfer line DL13 is used for data transfer, data latch circuit 410 changes reception selection signal D to the "H" level and changes reception selection signal ZD to the "L" level.

Figure 9:
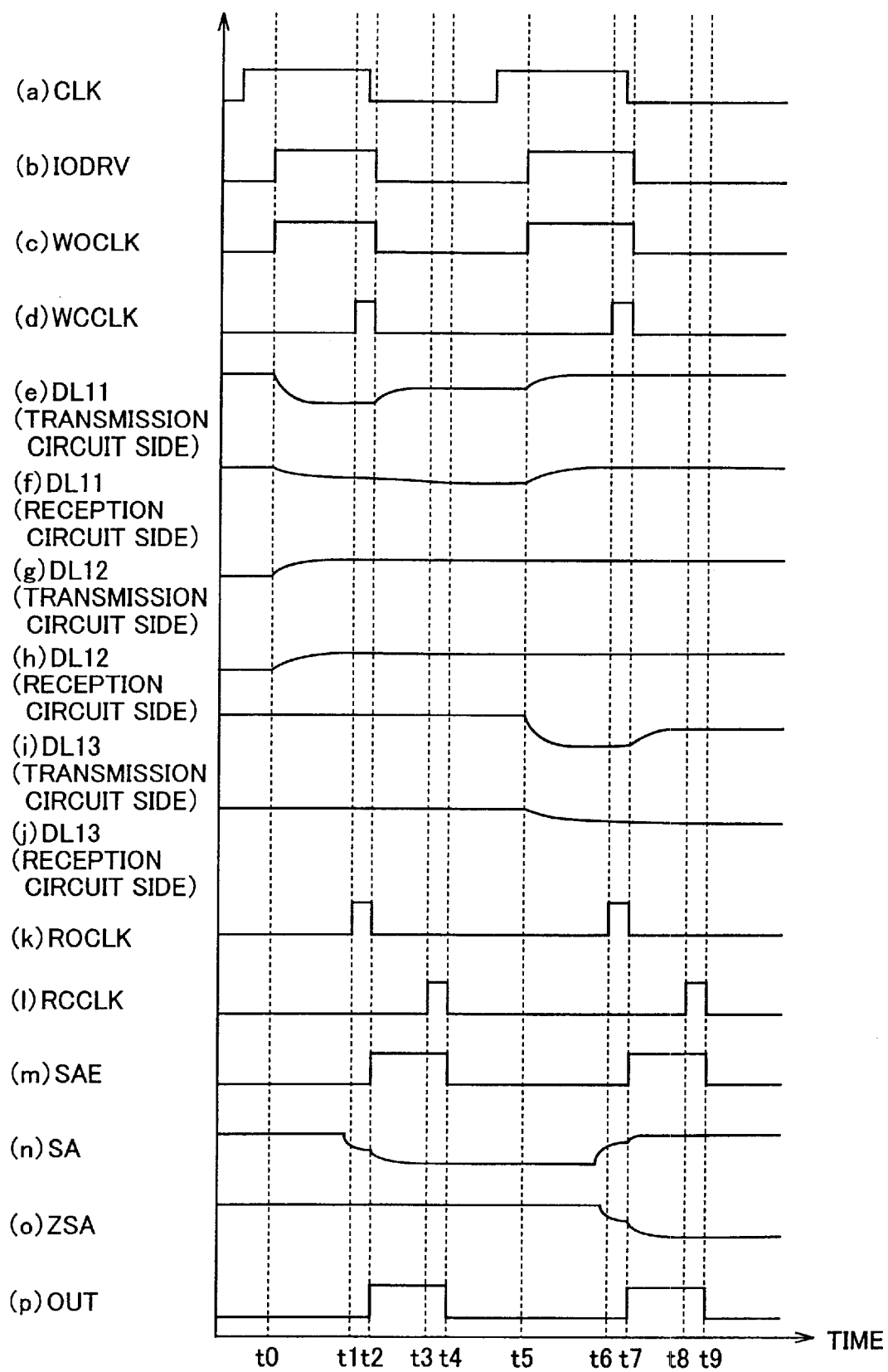
FIG. 9 is a timing chart for explaining operation of a data transfer circuit 5.

FIG. 9 is a timing chart for explaining operation of data transfer circuit 5 of the invention.

Referring to FIG. 9, the operation of data transfer circuit 5 will be described.

As an example, a case of transferring low-level data on data input/output line IO1 and selecting data transfer lines DL11 and DL13 will be described.

At time tO, activate signal IODRV and transmission data output control signal WOCLK are set to the "H" level to start data transfer.

Since data transfer lines DL11 and DL13 are selected in this case, as described above, transmission selection signals A, ZA, B, and ZB are at the "H", "L", "H", and "L" levels, respectively.

Data transfer line DL11 is therefore led to the "L" level.

Simultaneously, data transfer line DL12 which is not used for data transfer is precharged.

During the period from time t1 to t2 in which the potential of a data transfer line on the transmission side (DL11 in this case) is sufficiently dropped, transmission data input control signal WCCLK is set to the "H" level, the state of data transfer line is latched by data latch circuit 400, and a transmission selection signal for selecting the next data transfer line is generated.

During the period from time t1 to time t2, reception data output control signal ROCLK is set to the "H" level, data transfer lines DL11 and DL13 are selected by a reception selection signal from data latch circuit 410, and an input signal from transmission control circuit 9 is input to reception control circuit 10 via data transfer lines DL11 and DL13.

During the period from time t2 to time t4, SAE is set to the "H" level, output signals SA and ZSA of sense amplifier 720 are amplified, and amplified signals are output to data output buffer 7.

During the period from time t3 to time t4, output signals SA and ZSA sufficiently amplified by sense amplifier 720 are latched by data latch circuit 410, and a reception selection signal for selecting the next data transfer line is generated.

The above is the circuit operation of data transfer of one cycle. By repeating the operation, data is continuously transferred.

According to the invention, three data transfer lines are prepared and, while two out of the three data transfer lines are used to transfer data, the remaining data transfer line is precharged. The precharging period is therefore included in the data transfer period, and it is unnecessary to provide a specific precharge period after data transfer, so that data transfer can be performed efficiently.

There is a case that data transfer lines DL11 to DL13 are long. In such a case, parasitic capacitance of data transfer line is also large.

When the period in which activate signal IODRV is at the "H" level can be made long, the potential of the data transfer line on the reception control circuit 10 side is set to an almost ground voltage. When data transfer lines are long, the period becomes longer, so that it limits data transfer rate.

In the case of increasing data transfer rate, therefore, by limiting the period in which activate signal IODRV is at the "H" level, according to the length of the period, the potential of data transfer line in a portion close to reception control circuit 10 side becomes a potential between source voltage VDD and ground voltage GND.

Therefore, since it is unnecessary to set the data transfer line completely to the "H" or "L" level at the time of data transfer, data can be transfer at high speed and power consumption of charging/discharging the data transfer line can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data transfer circuit, comprising:

three data signal lines;

a first selection circuit for selecting two data signal lines having first and second potentials which are complementary to each other for transmitting data, out of said three data signal lines and for precharging a non-selected data signal line to said first potential; and a second selection circuit for selectively and electrically connecting said two data signal lines selected by said first selection circuit out of said three data signal lines to a reception side circuit, wherein said first selection circuit includes a driver circuit provided corresponding to each of said three data signal lines and connected between said first potential and a third potential, and said second potential is set to a level between said first and third potentials.

2. The data transfer circuit according to claim 1, wherein said first selection circuit selects two data signal lines of same potential levels out of said three data signal lines, on the basis of the potentials of predetermined two data signal lines out of said three data signal lines.

3. The data transfer circuit according to claim 1, wherein said second selection circuit includes an amplifying circuit for amplifying a potential difference between said two data signal lines selected by said first selection circuit out of said three data signal lines, and on the basis of the potential difference amplified by said amplifying circuit, selectively and electrically connects said two data signal lines selected by said first selection circuit to said reception side circuit.

4. The data transfer circuit according to claim 1, further comprising a latching circuit for holding the potentials of predetermined two data signal lines out of said three data signal lines as binary data; wherein said first selection circuit selects two data signal lines out of said three data signal lines on the basis of said binary data held by said latching circuit.

5. The data transfer circuit according to claim 4, wherein said first selection circuit includes a logic control section for selecting two data signal lines out of said three data signal lines and selecting one of said first potential and third potential supplied by said potential supply source to each of said three data signal lines.

6. The data transfer circuit according to claim 5, wherein said driver circuit is activated in response to a driver enable signal, and said second potential is set in accordance with an active period of said driver enable signal.

7. The semiconductor integrated circuit comprising:

a memory cell array having a plurality of memory cells arranged in a matrix;

an input/output control circuit for outputting data held in a selected memory cell designated on the basis of an address signal out of said memory cell;

a data buffer circuit for outputting a reading data read from said input/output control circuit to an external output-terminal;

a data transfer circuit placed between said input/output control circuit and said data buffer circuit and for transmitting said reading data to said data buffer circuit a first input/output line for transmitting said reading data from said input/output control circuit to said data transfer circuit, and a second input/output line for transmitting said reading data from said data transfer circuit to said data buffer circuit, and said data transfer circuit includes;

three data signal lines are longer than said first and second input/output line;

a first selection circuit for selecting two data signal lines whose potentials change to first and second potentials which are complementary to each other in accordance with said data to be transmitted out of said three data signal lines and for precharging a non-selected data signal line to said first potential;

a second selection circuit for selectively and electrically connecting said two data signal lines selected by said first selection circuit out of said three data signal lines to a reception side circuit; and said first selection circuit having a driver circuit provided corresponding to each of said three data signal lines and connected between said first potential and a third potential, and said logic control section for selecting two data signal lines out of said three data signal lines in conjunction with selecting one of said first potential and third potential supplied by said potential supply source to each of said three data signal lines and said driver circuit activates on the basis of a driver enable signal, and said second potential is set to a level between said first and third potentials by a period of time during supplying said driver enable signal, said second selection circuit having an amplifying circuit for amplifying a potential difference between said two data signal lines selected by said first selection circuit out of said three data signal lines, and on the basis of the potential difference amplified by said amplifying circuit, selectively and electrically connects said two data signal lines having selected by said first selection circuit to said second input/output line.

* * * * *